US012595999B2

(12) United States Patent
Kikuchi

(10) Patent No.: US 12,595,999 B2
(45) Date of Patent: Apr. 7, 2026

(54) FILM THICKNESS MEASURING DEVICE, FILM FORMING SYSTEM, AND FILM THICKNESS MEASURING METHOD

(71) Applicant: Tokyo Electron Limited, Tokyo (JP)

(72) Inventor: Yusuke Kikuchi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1093 days.

(21) Appl. No.: 17/669,639

(22) Filed: Feb. 11, 2022

(65) Prior Publication Data

US 2022/0260362 A1 Aug. 18, 2022

(30) Foreign Application Priority Data

Feb. 17, 2021 (JP) ................................. 2021-023210

(51) Int. Cl.
| | | |
|---|---|---|
| *H01L 21/67* | (2006.01) | |
| *G01B 11/06* | (2006.01) | |
| *H01L 21/687* | (2006.01) | |
| *H10N 50/01* | (2023.01) | |

(52) U.S. Cl.
CPC .... *G01B 11/0683* (2013.01); *H01L 21/67253* (2013.01); *H01L 21/68764* (2013.01); *H10N 50/01* (2023.02)

(58) Field of Classification Search
CPC ............ G01B 11/0683; G01B 11/0625; H01L 21/67253; H01L 21/68764; H01L 21/67207; H01L 21/67259; H01L 22/12; H01L 21/68; H10N 50/01; C23C 16/52; C23C 16/4584; C23C 16/54
See application file for complete search history.

(56) References Cited

U.S. PATENT DOCUMENTS

2008/0187413 A1* 8/2008 Kondoh .................. H01L 21/68
414/217

FOREIGN PATENT DOCUMENTS

| | | | | |
|---|---|---|---|---|
| JP | H05-149720 A | 6/1993 | | |
| JP | H05280937 A | * 10/1993 | ............. | G01B 11/06 |
| JP | H11-330185 A | 11/1999 | | |
| JP | 2015-099898 A | 5/2015 | | |
| JP | 2015232450 A | * 12/2015 | ............. | H01L 21/66 |
| JP | 6160614 B2 | 7/2017 | | |
| JP | 2018-119907 A | 8/2018 | | |
| KR | 10-2001-0072848 A | 7/2001 | | |
| KR | 10-2008-0073237 A | 8/2008 | | |
| KR | 10-2009-0028462 A | 3/2009 | | |
| WO | 2015178109 A | 11/2015 | | |

* cited by examiner

*Primary Examiner* — Mohammed Shamsuzzaman
(74) *Attorney, Agent, or Firm* — Venjuris, P.C.

(57) ABSTRACT

A film thickness measuring device includes: a stage on which a substrate is disposed; a light emitter/receiver configured to emit light for measuring a film thickness to the substrate disposed on the stage and receive a reflected light from the substrate disposed on the stage; a rotation mechanism configured to rotate the stage; an orientation detector configured to detect an orientation of the stage; and a controller. Based on a detection result by the orientation detector, the controller controls the rotation mechanism so that the orientation of the stage becomes a desired orientation when the substrate is disposed.

4 Claims, 5 Drawing Sheets

FILM THICKNESS MEASURING DEVICE, FILM FORMING SYSTEM, AND FILM THICKNESS MEASURING METHOD

CROSS-REFERENCE TO RELATED APPLICATION

This application is based on and claims priority from Japanese Patent Application No. 2021-023210 filed on Feb. 17, 2021 with the Japan Patent Office, the disclosure of which is incorporated herein in its entirety by reference.

TECHNICAL FIELD

The present disclosure relates to a film thickness measuring device, a film forming system, and a film thickness measuring method.

BACKGROUND

Japanese Patent No. 6160614 discloses a vacuum processing apparatus for forming a stacked film used for a magnetoresistive random access memory (MRAM). In the vacuum processing apparatus, when manufacturing a stacked film, processing modules surrounding transfer modules are sequentially used, and a series of plural processes are performed on a substrate in a vacuum atmosphere.

Japanese Patent Laid-Open Publication No. H05-149720 discloses a method for enabling an in-situ measurement of a film growth process when forming an oxide superconducting film on various substrates by chemical vapor deposition method.

Japanese Patent Laid-Open Publication No. H11-330185 discloses a manufacturing apparatus of a clustered semiconductor device that includes at least a first reaction chamber for performing a first process on a substrate and a second reaction chamber for performing a second process on the substrate. The manufacturing apparatus is configured such that a common space including the first reaction chamber and the second reaction chamber may be maintained in an isolated environment from the atmosphere and the substrate may be transferred between the first reaction chamber and the second reaction chamber. Further, the manufacturing apparatus includes an optical measuring unit for gloss evaluation of a surface state of the substrate in a state where the substrate is grounded to any portion in the common space.

SUMMARY

According to an aspect of the present disclosure, a film thickness measuring device measures the thickness of a film formed on a substrate. The film thickness measuring device includes: a stage configured to dispose the substrate thereon; a light receiving/emitting unit configured to emit light for measuring a film thickness to the substrate on the stage and receive a reflected light from the substrate disposed on the stage; a rotation mechanism configured to rotate the stage; an orientation detector configured to detect an orientation of the stage; and a controller. Based on a detection result detected by the orientation detector, the controller controls the rotation mechanism such that the orientation of the stage becomes a desired orientation when the substrate is disposed.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
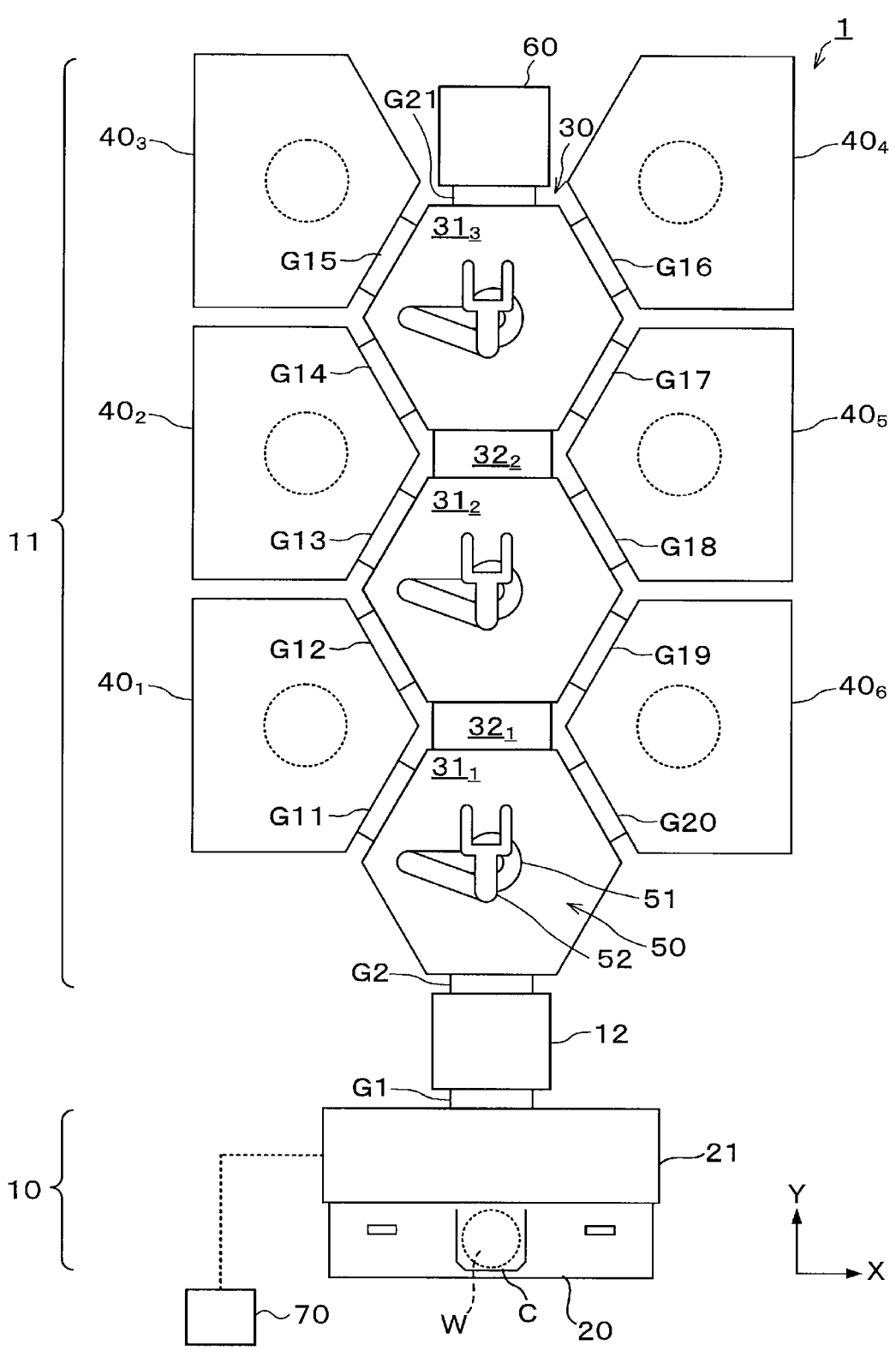
FIG. 1 is a schematic plane view illustrating an example of a film forming system including a film thickness measuring device according to the present embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

As for magnetic devices such as magnetic heads of MRAMs and hard disk drives (HDDs), stacked films formed by stacking ultrathin films of 10 nm or less are used. As a film forming system for forming such stacked films, a system is known in which a plurality of processing devices is connected to a vacuum transfer device and a film of each layer is sequentially formed by each processing device.

Further, it is required to confirm whether each formed film has a desired thickness without taking out the film from the vacuum atmosphere portion of the film forming system.

Therefore, it is considered to measure the thickness of the film formed by the processing device of the film forming system in situ. Specifically, for example, it is considered to provide the film forming system with a film thickness measuring device, which is connected to a vacuum transfer device and has a vacuum atmosphere inside, transfer the substrate on which the film is formed by the processing device from the processing device to the film thickness measuring device by the vacuum transfer device, and measure the thickness of the film on the substrate by the film thickness measuring device.

The above-mentioned film thickness measuring device may include a container, a stage, a light receiving/emitting unit, and a moving mechanism.

The above-mentioned container is configured to be decompressible, and a stage is provided inside the container. A substrate is disposed on the stage. The light receiving/emitting unit includes a light emitting portion that emits light for film thickness measurement on the disposed substrate, and a light receiving portion that receives the reflected light emitted from the light emitting portion and reflected on the substrate on the stage. The moving mechanism moves an irradiation point of the light from the light emitting unit with respect to the substrate on the stage. A rotation mechanism rotates the stage and constitutes, for example, a part of the moving mechanism.

In the film thickness measuring device having this configuration, the irradiation point is moved by the moving mechanism, and the film thickness of a portion of the substrate corresponding to the irradiation point is calculated based on the light receiving result of the reflected light by the light receiving portion for each irradiation point. As a result, the in-plane distribution of the thickness of the film formed on the substrate is obtained.

However, even when an inclination of the stage (specifically, an inclination of the stage surface on which the substrate is disposed with respect to the horizontal plane) is adjusted when assembling the film thickness measuring device, the inclination (specifically, the inclination of the stage surface on which the substrate is disposed with respect to the horizontal plane) may not be set to 0°. For example, the adjusted stage is inclined by about 0.02°. Further, at present, the orientation (rotation angle) of the stage when the substrate is disposed on the stage is not controlled. This point does not matter especially when the film of the measurement target is thick and accuracy is not required. However, when the film thickness of the measurement target is as thin as 10 nm or less and accuracy is required, even when the film formation recipe is the same, it is presumed that the measurement result (including the in-plane distribution of the film thickness) by the film thickness measuring device would be different for each substrate. In fact, the diligent research conducted by the present inventors confirms that this presumption is correct.

Therefore, the technique according to the present disclosure suppresses a measurement result of the film thickness of the substrate on the stage from varying for each substrate due to the inclination of the stage on which the substrate is disposed.

Hereinafter, a film thickness measuring device, a film forming system, and a film thickness measuring method according to the present embodiment will be described with reference to the accompanying drawings. In the present specification, elements having substantially the same functional configuration are designated by the same reference numerals, and duplicate descriptions thereof will be omitted.

<Film Forming System>

FIG. 1 is a schematic plane view illustrating an example of a film forming system including a film thickness measuring device according to the present embodiment.

The film forming system 1 has a configuration in which a cassette station 10 that loads/unloads a cassette C capable of accommodating a plurality of semiconductor wafers (hereinafter, referred to as "wafers") W serving as substrates, and a processing station 11 that performs a plurality of processes including a magnetic film forming process on each wafer W are integrally connected with each other. The cassette station 10 and the processing station 11 are connected via a load lock device 12. The load lock device 12 is provided to connect an atmospheric pressure transfer device 21 and a vacuum transfer device 30, which will be described later. The load lock device 12 is configured such that the inside thereof may be switched between an atmospheric pressure state and a vacuum state.

The cassette station 10 includes a cassette stage 20 and an atmospheric pressure transfer device 21. The cassette station 10 may be further provided with an orientator (not illustrated) that adjusts the orientation of the wafer W.

The cassette stage 20 is provided at the end of the film forming system 1 in the negative direction of the Y direction (the downward direction in FIG. 1). A plurality of cassettes C, for example, three cassettes C may be disposed on the cassette stage 20.

The atmospheric pressure transfer device 21 transfers the wafer W in a state of atmospheric pressure by a wafer transfer mechanism (not illustrated). The wafer transfer mechanism has a transfer arm that holds the wafer W substantially horizontally. The transfer arm is configured to be rotatable and expandable/contractable and is provided to be able to move vertically and horizontally. The wafer transfer mechanism is configured to transfer the wafer W while holding the wafer W by the transfer arm.

The load lock device 12 is connected to the atmospheric pressure transfer device 21 in the positive direction of the Y direction (the upward direction in FIG. 1) via a gate valve G1. The vacuum transfer device 30 of the processing station 11, specifically, a vacuum transfer chamber $31_1$ (to be described later) is connected to the load lock device 12 in the positive direction of the Y direction via a gate valve G2.

The processing station 11 includes a vacuum transfer device 30, a plurality of (six in this example) processing devices $40_1$ to $40_6$ (hereinafter, a part or all of them may be collectively referred to as a "processing device 40"), and a film thickness measuring device 60. The vacuum transfer device 30, the inside of the processing device 40, and the film thickness measuring device 60 are each maintained in an atmosphere (vacuum atmosphere) depressurized from the atmospheric pressure during a series of processes on the wafer W in the film forming system 1.

The vacuum transfer device 30 is formed by connecting a plurality of (three in this example) vacuum transfer chambers $31_1$ to $31_3$ (hereinafter, a part or all of them may be collectively referred to as a "vacuum transfer chamber 31") via relay chambers $32_1$ and $32_2$ (hereinafter, they may be collectively referred to as a "relay chamber 32").

Each of the vacuum transfer chamber 31 and the relay chamber 32 has a housing with a sealable structure which is formed to have a substantially polygonal shape in a plane view.

Processing devices $40_1$ to $40_3$ are disposed along the Y direction (i.e., the vertical direction in the figure) on the outside of the vacuum transfer device 30 in the negative direction of the X direction (the left side in the figure), and are connected to the corresponding vacuum transfer chambers 31. Specifically, the processing device $40_1$ is connected to the vacuum transfer chamber $31_1$ and the vacuum transfer chamber $31_2$ via the gate valves G11 and G12, the processing device $40_2$ is connected to the vacuum transfer chamber $31_2$ and the vacuum transfer chamber $31_3$ via gate valves G13 and G14, and the processing device $40_3$ is connected to the vacuum transfer chamber $31_3$ via a gate valve G15.

Further, processing devices $40_4$ to $40_6$ are disposed along the Y direction (i.e., the vertical direction in the figure) on the outside of the vacuum transfer device 30 in the positive direction of the X direction (the right direction in the figure), and are connected to the corresponding vacuum transfer chambers 31. Specifically, the processing device $40_4$ is connected to the vacuum transfer chamber $31_3$ via a gate valve G16, the processing device $40_5$ is connected to the vacuum transfer chamber $31_3$ and the vacuum transfer chamber $31_2$ via gate valves G17 and G18, and the processing device $40_6$ is connected to the vacuum transfer chamber $31_2$ and the vacuum transfer chamber $31_1$ via gate valves G19 and G20.

Further, a film thickness measuring device 60 is disposed outside the vacuum transfer device 30 in the positive direction of the Y direction (the upward direction in the figure). The film thickness measuring device 60 is connected to the vacuum transfer chamber $31_3$ via a gate valve G21.

Each of the vacuum transfer chambers 31 takes out the wafer W from the modules (the processing device 40, the relay chamber 32, the load lock device 12, and the film thickness measuring device 60) adjacent to the vacuum transfer chamber 31, and transfers the wafer W to another module adjacent to the vacuum transfer chamber 31.

Further, a wafer transfer mechanism 50 is provided inside each vacuum transfer chamber 31 to transfer the wafer W. The wafer transfer mechanism 50 has a transfer arm 51 that holds the wafer W substantially horizontally. The transfer arm 51 is configured to be able to expand/contract and rotate in the horizontal direction. Further, the wafer transfer mechanism 50 has an elevating unit 52 provided in the lower part of the transfer arm 51. The transfer arm 51 is configured to vertically move up and down by the elevating unit 52. The wafer transfer mechanism 50 is configured to transfer the wafer W while holding the wafer W by the transfer arm 51. In the following, the wafer transfer mechanism $\mathbf{50}_n$ and the transfer arm $\mathbf{51}_n$ (n=1 to 3) mean the wafer transfer mechanism 50 provided in a vacuum transfer chamber $\mathbf{31}_n$ and the transfer arm 51 included in the wafer transfer mechanism 50, respectively.

The relay chamber 32 is a module used when the wafer W is directly delivered between the adjacent vacuum transfer chambers 31 without going through the processing device 40. The internal spaces of the adjacent vacuum transfer chambers 31 communicate with each other via the internal space of the relay chamber 32, which enables the above-mentioned delivery. The relay chamber 32 and the vacuum transfer chamber 31 may be connected via a gate valve.

The processing devices $\mathbf{40}_1$ to $\mathbf{40}_6$ are provided to form a plurality of films on the wafer W, that is, form a stacked film, and may include performing a film formation process such as a PVD process, and performing a cleaning process, a pre-process, and a cooling process.

The process performed on the wafer W may be different for each processing device 40, or the process performed on the wafer W may be common to certain processing devices 40.

The film thickness measuring device 60 measures the thickness of the film formed by any of the processing devices 40 and the thickness of the stacked film formed by the processing station 11. The position of the film thickness measuring device 60 is not limited to the position of this example. Further, a plurality of film thickness measuring devices 60 may be provided in the film forming system 1. Details of the film thickness measuring device 60 will be described later.

The film forming system 1 configured as described above is provided with a controller 70. The controller 70 is constituted by, for example, a computer equipped with a CPU or a memory, and has a storage unit (not illustrated) for storing various types of information. The storage unit stores, for example, a program for controlling the drive unit of each device and each mechanism to implement wafer processes (to be described later) in the film forming system 1 and a program for controlling the drive unit to implement the film thickness measurement by the film thickness measuring device 60. The program may be recorded on a non-temporary storage medium readable by a computer, and may be installed on the controller 70 from the storage medium.

Next, descriptions will be made on the wafer processes using the film forming system 1 configured as described above.

First, the cassette C accommodating a plurality of wafers W is loaded into the cassette station 10 of the film forming system 1 and disposed on the cassette stage 20. Thereafter, a single wafer W is taken out from the cassette C by the wafer transfer mechanism (not illustrated) of the atmospheric pressure transfer device 21, the gate valve G1 is opened, and the wafer W is loaded into the load lock device 12. When the wafer W is loaded into the load lock device 12, the gate valve G1 is closed, the inside of the load lock device 12 is sealed, and the pressure is reduced. Thereafter, the gate valve G2 is opened, and the load lock device 12 and the vacuum transfer chamber $\mathbf{31}_1$ which has been evacuated in advance communicate with each other. Then, the wafer W is unloaded from the load lock device 12 by the transfer arm $\mathbf{51}_1$ of the wafer transfer mechanism $\mathbf{50}_1$, and is loaded into the vacuum transfer chamber $\mathbf{31}_1$.

Subsequently, the gate valve G2 is closed, the gate valve G11 is opened, and the vacuum transfer chamber $\mathbf{31}_1$ and the processing device $\mathbf{40}_1$ communicate with each other. Then, the wafer W is loaded into the vacuum transfer chamber $\mathbf{40}_1$ by the transfer arm $\mathbf{51}_1$ of the wafer transfer mechanism $\mathbf{50}_1$.

Then, after the gate valve G11 is closed and the processing device $\mathbf{40}_1$ is sealed, a predetermined process is performed on the wafer W in the processing device $\mathbf{40}_1$.

When the process in the processing device $\mathbf{40}_1$ is completed, the gate valve G12 is opened, and the processing device $\mathbf{40}_1$ and the vacuum transfer chamber $\mathbf{31}_2$ communicate with each other. Then, the wafer W is unloaded from the processing device $\mathbf{40}_1$ by the transfer arm $\mathbf{51}_2$ of the wafer transfer mechanism $\mathbf{50}_2$, and is loaded into the vacuum transfer chamber $\mathbf{31}_2$.

After that, in the same manner as described above, drive sources such as the gate valves G12 to G20 and G2 and the transfer arms $\mathbf{51}_2$ to $\mathbf{51}_4$ are driven such that the wafer W is transferred between the vacuum transfer chamber 31 and the processing device 40 in the following order.

Processing device $\mathbf{40}_2 \rightarrow$ vacuum transfer chamber $\mathbf{31}_3 \rightarrow$ processing device $\mathbf{40}_3 \rightarrow$ vacuum transfer chamber $\mathbf{31}_3 \rightarrow$ processing device $\mathbf{40}_4 \rightarrow$ vacuum transfer chamber $\mathbf{31}_3 \rightarrow$ processing device $\mathbf{40}_5 \rightarrow$ vacuum transfer chamber $\mathbf{31}_2 \rightarrow$ processing device $\mathbf{40}_6 \rightarrow$ vacuum transfer chamber $\mathbf{31}_1 \rightarrow$ load lock device 12

Then, a predetermined process is performed on the wafer W by each of the processing devices $\mathbf{40}_1$ to $\mathbf{40}_6$.

The wafer W returned to the load lock device 12 is returned to the original cassette C in a reverse procedure of loading from the cassette C.

A series of wafer processes as described above is performed on each wafer W, and a stacked film is formed on each wafer W.

During such a series of wafer processes, when it is necessary to measure the thickness of a film after the film is formed, the wafer W on which the film is formed is transferred to the film thickness measuring device 60 to measure the film thickness. At this time, the wafer W is unloaded from the processing device after the film formation by the wafer transfer mechanism 50 in the corresponding vacuum transfer chamber. Then, after the wafer W is transferred to one or more wafer transfer mechanisms 50 as needed, the gate valve G21 is opened, and the wafer W is transferred to the film thickness measuring device 60 by the wafer transfer mechanism $\mathbf{50}_3$. The film thickness may be measured every time the film forming process is performed by the processing device for the film forming process, may be measured after the film forming process has been performed by certain processing devices, or may be measured after all the films have been formed.

<Film Thickness Measuring Device 60>

Figure 2:
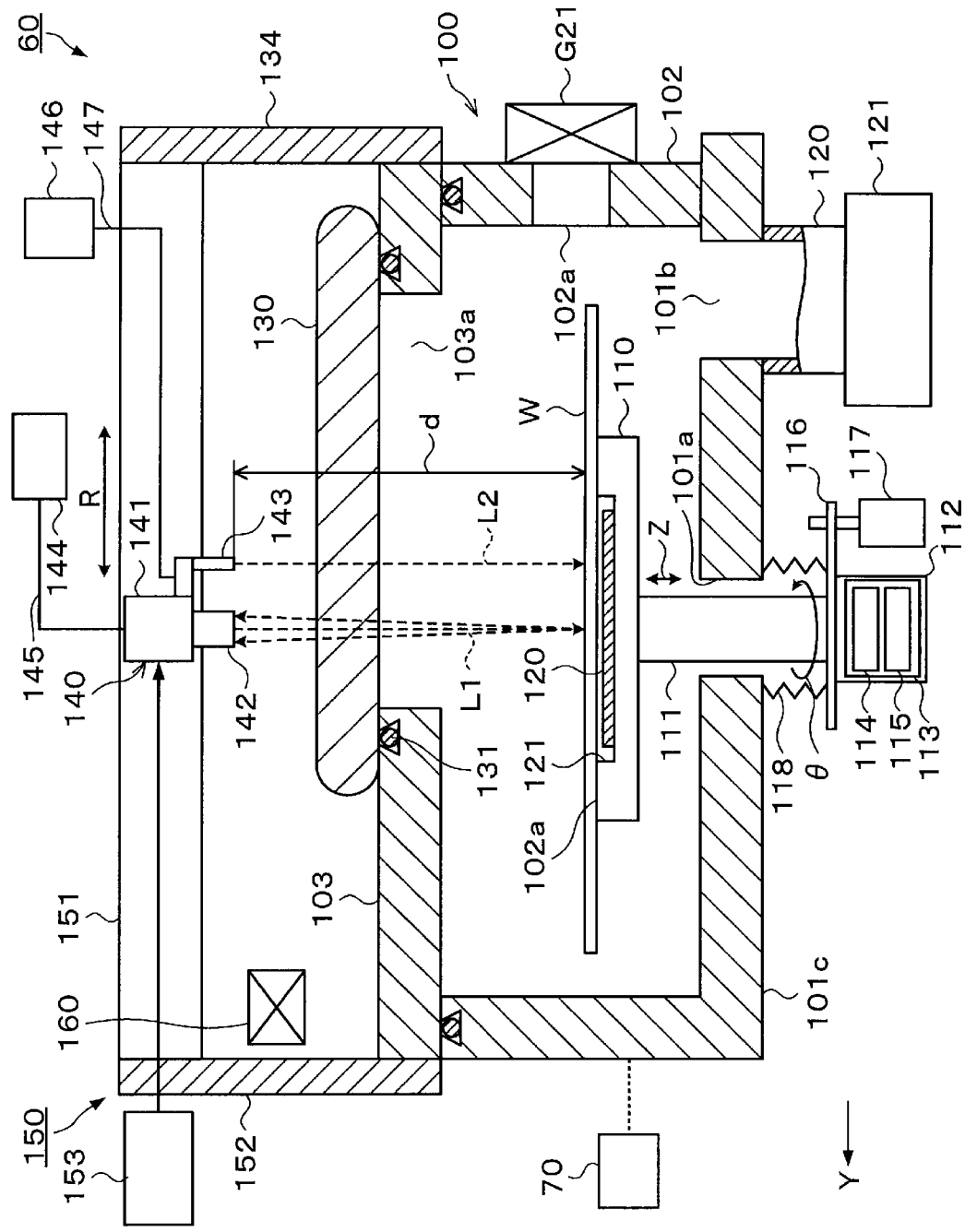
FIG. 2 is a vertical cross-sectional view illustrating an example of the film thickness measuring device.

Subsequently, the film thickness measuring device 60 will be described with reference to FIG. 2. FIG. 2 is a vertical cross-sectional view illustrating an example of the film thickness measuring device 60.

For example, as illustrated in FIG. 2, the film thickness measuring device 60 includes a chamber 100 serving as a container configured to be decompressible. In the chamber 100, a stage 110 is provided as a mounting table on which the wafer W is disposed.

Specifically, the wafer W is disposed on the upper surface of the stage 110. Further, the stage 110 is configured to be able to rotate and move up and down. For the stage 110, a lifter (not illustrated) used for transferring the wafer W to and from the wafer transfer mechanism 50₃ is provided to be able to protrude or retract with respect to the surface of the stage 110. The stage 110 may be provided with a temperature control mechanism such as a heater in order to control the temperature of the wafer W disposed on the stage 110. Further, the wafer W may be heated or cooled by using the temperature control mechanism.

A support shaft 111 is connected to the center of the bottom surface of the stage 110. The support shaft 111 extends to the lower part of the chamber 100 through a through hole 101a formed in the bottom wall 101 of the chamber 100 and is connected to a rotation mechanism 112.

The rotation mechanism 112 rotates the stage 110, specifically, rotates the stage 110 via the support shaft 111. The rotation mechanism 112 has a drive unit 113 that drives the rotation of the stage 110. The drive unit 113 has, for example, a motor 114 as a drive unit that generates the drive force for the above-mentioned rotation. The motor 114 has a rotation shaft (not illustrated) connected to the support shaft 111. Further, the drive unit 113 has an absolute encoder 115 connected to the motor 114.

The absolute encoder 115 has a rotation shaft (not illustrated) coaxial with the rotation shaft of the motor 114, and detects, for example, the rotation angle of the rotation shaft of the motor 114. Specifically, the absolute encoder 115 forms a light transmission/non-transmission pattern by a slit shape formed on the rotating plate, and detects the rotation position, that is, the rotation angle (absolute angle) from an arbitrary reference point of the rotation shaft of the motor 114 from the pattern. Since the rotation angle of the rotation shaft of the motor 114 matches the rotation amount of the support shaft 111 connected to the stage 110, it matches the rotation angle of the stage 110, that is, the orientation of the stage 110. That is, the absolute encoder 115 is an orientation detector that detects the orientation (rotation angle) of the stage 110. The motor 114 is controlled by the controller 70, and the detection result of the absolute encoder 115 is output to the controller 70.

Further, the rotation mechanism 112 is attached to a lifting plate 116, and a lifting mechanism 117 serving as an adjustment mechanism is connected to the lifting plate 116. The lifting mechanism 117 is constituted by, for example, a piezoelectric actuator, and raises and lowers the stage 110 via the lifting plate 116 and the support shaft 111. As a result, the height of the stage 110 may be finely adjusted. The lifting mechanism 117 is controlled by the controller 70. A stretchable bellows 118 is airtightly provided between the bottom wall 101 and the lifting plate 116 to surround the support shaft 111.

An exhaust port 101b is formed on the bottom wall 101 of the chamber 100, an exhaust pipe 120 is connected to the exhaust port 101b, and an exhaust mechanism 121 having a pressure control valve and a vacuum pump is connected to the exhaust pipe 120. By operating the exhaust mechanism 121, the inside of the chamber 100 may be made into a vacuum atmosphere.

The side wall 102 of the chamber 100 is provided with a loading outlet 102a of the wafer W, and the loading outlet 102a may be opened and closed by the above-mentioned gate valve G21.

The top wall (lid) 103 of the chamber 100 is formed with elongated through holes 103a extending in the radial direction of the wafer W. The through hole 103a is covered with a light-transmitting member 130 made of, for example, quartz, which is transmitted by a light for film thickness measurement and a laser for distance measurement (to be described later). A seal ring 131 seals the space between the light-transmitting member 130 and the top wall 103.

An optical assembly 140 is provided in the atmosphere region above a position corresponding to the through hole 103a of the chamber 100. The optical assembly 140 includes a main body 141, a light receiving/emitting unit 142, and a laser unit 143.

The light receiving/emitting unit 142 and the laser unit 143 are attached to the main body 141 in a state of being adjacent to each other.

The light receiving/emitting unit 142 emits light L1 for film thickness measurement toward the wafer W on the stage 110, and also receives the reflected light of the emitted light L1 by the wafer W on the stage 110. The light receiving/emitting unit 142 has a light emitting portion (not illustrated) that emits light L1 for film thickness measurement toward the wafer W, and a light receiving portion (not illustrated) that receives, that is, detects the reflected light.

The light emitting unit emits light L1 guided from a light source unit 144 via an optical fiber 145. The light emitted from the light emitting unit irradiates the wafer W on the stage 110 through the light-transmitting member 130 and the through hole 103a.

The light source unit 144 includes a light source and an amplifier that amplifies the light from the light source. As for the light source, a lamp light source that emits broad light having a short wavelength of about 800 nm or less may be used.

The light receiving portion has a light receiving sensor (not illustrated) that receives, that is, detects the above-mentioned reflected light.

The light emitting portion (specifically, the light source unit 144) is controlled by the controller 70, and the light receiving result of the reflected light by the light receiving portion is output to the controller 70. The controller 70 measures the thickness of the film formed on the wafer W based on the light receiving result of the reflected light.

The laser unit 143 includes a laser light emitting portion that emits laser L2 for distance measurement downward, that is, toward the stage 110, and a laser light receiving portion that receives the reflected light of the emitted laser L2 by the wafer W on the stage 110 or the light reflected by the stage 110 on which the wafer W is not disposed.

The laser light emitting portion emits the laser light guided from the laser light source unit 146 via the optical fiber 147. The laser light emitted from the laser light emitting portion irradiates the wafer W of the stage 110 or the stage 110 through the light-transmitting member 130 and the through hole 103a.

The laser light receiving portion has a light receiving sensor (not illustrated) that receives, that is, detects the above-mentioned reflected light.

The laser light emitting portion (specifically, the light source unit 146) is controlled by the controller 70, and the light receiving result of the laser light reflected by the laser light receiving portion (hereinafter, referred to as "reflected laser light" in some cases) is output to the controller 70.

Based on the light receiving result of the reflected laser light, the controller 70 measures a distance between the light receiving/emitting unit 142 and the wafer W, specifically, a distance d between the light receiving sensor of the light receiving portion of the light receiving/emitting unit 142 and the wafer W on the stage 110 (hereinafter, referred to as a "relative working distance d" in some cases). For example, a laser light source unit 146, an optical fiber 147, and a distance estimator (to be described later) constitute a distance measuring unit.

Further, a horizontal movement mechanism 150 is provided in the upper part of the chamber 100.

The horizontal movement mechanism 150 includes a linear guide 151 that guides the main body 141 of the optical assembly 140. The linear guide 151 is horizontally disposed to extend in the device depth direction (i.e., the Y direction in the figure) coincident with the radial direction of the stage 110 while being supported by the top wall 103 of the chamber 100 via a support member 152.

The main body 141 of the optical assembly 140 is configured as a slider guided by the linear guide 151. The horizontal movement mechanism 150 has a drive unit 153 that drives the movement of the main body 141 along the linear guide 151. The drive unit 153 has, for example, a motor serving as a drive unit that generates the drive force for the above-mentioned movement.

With the configuration as described above, the horizontal movement mechanism 150 may horizontally move the entire optical assembly 140 having the light receiving/emitting unit 142 and the laser unit 143 in the device depth direction (i.e., the Y direction in the figure) that coincides with the radial direction of the stage 110 along the linear guide 15.

The horizontal movement mechanism 150 may horizontally move the irradiation point of the light emitted from the light receiving/emitting unit 142 to the wafer W on the stage 110 in the device depth direction (i.e., the Y direction in the figure) that coincides with the radial direction of the stage 110. Similarly, the horizontal movement mechanism 150 may horizontally move the irradiation point of the laser light emitted from the laser unit 143 to the wafer W on the stage 110 and the irradiation point to the stage 110 in the device depth direction (i.e., the Y direction in the figure).

Further, the rotation mechanism 112 may move the irradiation point of the light emitted from the light receiving/emitting unit 142 to the wafer W on the stage 110 in the circumferential direction (i.e., θ direction) about the rotation shaft of the rotation mechanism 112 that coincides with the rotation shaft of the stage 110. Similarly, the rotation mechanism 112 may the irradiation point of the laser light emitted from the laser unit 143 to the wafer W on the stage 110 and the irradiation point to the stage 110 in the circumferential direction (i.e., θ direction).

That is, the horizontal movement mechanism 150 and the rotation mechanism 112 function as moving mechanisms that move the followings:

the irradiation point of the light emitted from the light receiving/emitting unit 142 to the wafer W on the stage 110;

the irradiation point of the laser light emitted from the laser unit 143 to the wafer W on the stage 110; and the irradiation point of the laser light emitted from the laser unit 143 to the stage 110.

A cooling fan 160 is provided in the upper part of the chamber 100 to cool the optical assembly 140. The cooling fan 160 is particularly effective when the stage 110 is heated by a heater.

A cover may be provided in the optical path of the light receiving/emitting unit 142 and the laser unit 143.

<Controller 70>

Figure 3:
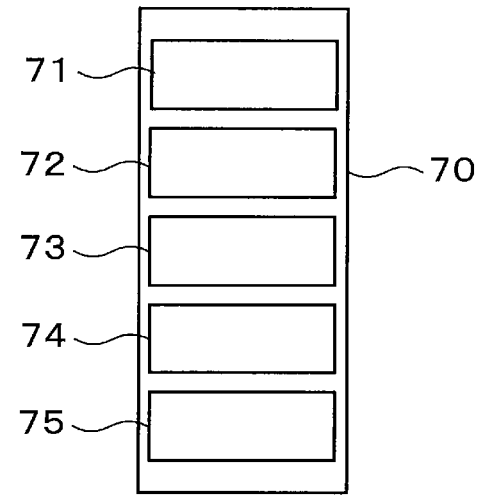
FIG. 3 is a functional block diagram of a controller relating to film thickness measurement.

FIG. 3 is a functional block diagram of a controller 70 relating to film thickness measurement.

As illustrated in FIG. 3, the controller 70 includes a movement controller 71, a film thickness estimator 72, an orientation controller 73, a distance estimator 74, and a height controller 75 serving as an adjustment mechanism, which are implemented by a processor such as a CPU reading and executing a program stored in the storage unit.

The movement controller 71 controls the horizontal movement mechanism 150 and the rotation mechanism 112 (specifically, the drive unit 153 and the drive unit 113) to control the movement of the following irradiation points:

the irradiation point of the light emitted from the light receiving/emitting unit 142 to the wafer W on the stage 110;

the irradiation point of the laser light emitted from the laser unit 143 to the wafer W on the stage 110; and the irradiation point of the laser light emitted from the laser unit 143 to the stage 110.

The movement controller 71 may move the irradiation point to the film thickness measurement point. The origin of the R-direction position of the irradiation point (specifically, the position in the radial direction of the stage 110) is, for example, the center of the stage 110. Further, the origin of the position in the θ direction of the irradiation point (specifically, the position in the rotation direction of the stage 110) is the position in the rotation direction of the stage 110 when the wafer W is disposed. For example, the origin of the position in the θ direction (θ coordinate) of the irradiation point is the position in the rotation direction of the stage when the stage 110 is rotated so that the wafer W is oriented in a predetermined direction after the wafer W is disposed on the stage 110.

The number of film thickness measurement points is, for example, plural, and more specifically, for example, a total of one point in the center of the wafer W and four points in each of the three annular regions obtained by dividing the outer peripheral region excluding the central region of the wafer W into three in the radial direction, that is, thirteen points.

The film thickness estimator 72 estimates the thickness of the film formed on the wafer W based on the light receiving result of light L1 emitted from the light receiving/emitting unit 142 at the light receiving portion of the reflected light by the wafer W on the stage 110. The film thickness estimator 72 estimates the film thickness at each film thickness measurement point.

Further, as a method of estimating the film thickness based on the light receiving result of the reflected light, for example, a spectroscopic interference method may be used. By using a broad light having a short wavelength of about 800 nm or less as light L1 for film thickness measurement and using the spectroscopic interference method for film thickness estimation, it is possible to measure the film thickness of an ultrathin film having a film thickness of 10 nm or less and further 1 nm or less. An ellipsometry method may be used as a method of estimating the film thickness based on the light receiving result of the reflected light.

The orientation controller 73 controls the rotation mechanism 112 based on the detection result of the orientation of the stage 110 by the absolute encoder 115, and controls and adjusts the orientation of the stage 110 when the wafer W is disposed (hereinafter, referred to as an "orientation of the stage at the time of disposing" in some cases). Specifically, the orientation of the stage at the time of disposing refers to the orientation of the stage 110 when the wafer W is disposed on the stage 110 from the wafer transfer mechanism 503 of the vacuum transfer device 30.

Figure 4:
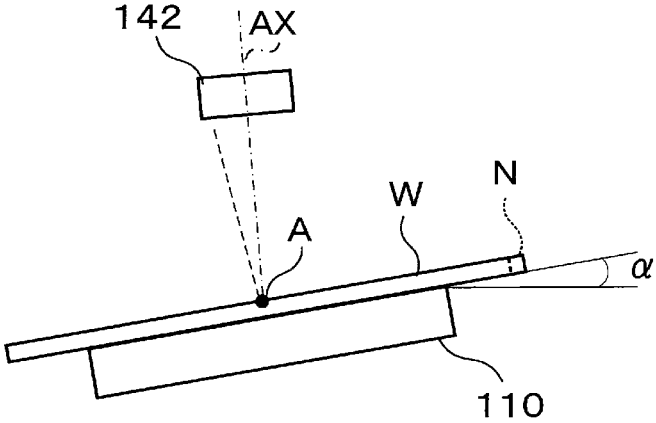
FIG. 4 is a diagram illustrating a reason for adjusting the orientation of a stage when a substrate is disposed.
Figure 5:
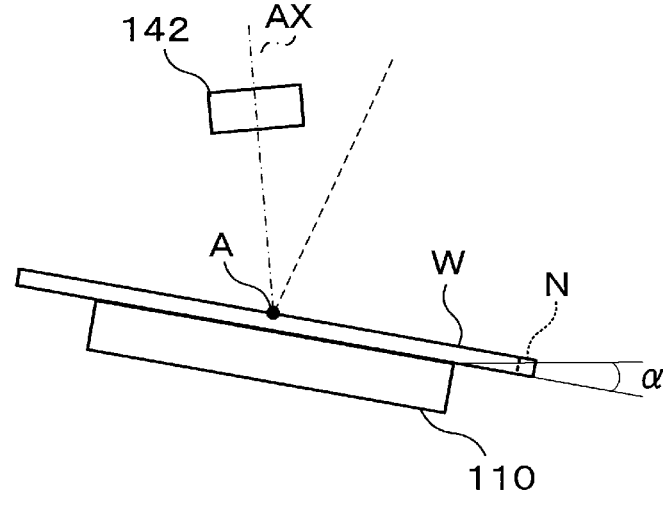
FIG. 5 is a diagram illustrating a reason for adjusting the orientation of the stage when the substrate is disposed.

In the film thickness measuring device 60, even when the inclination of the stage 110 (specifically, the inclination of the wafer placement surface with respect to the horizontal plane) is adjusted at the time of assembling the film thickness measuring device 60, the inclination thereof cannot be set to 0°. Further, in the related art, since the orientation (rotation angle) of the stage 110 when the wafer W is disposed on the stage 110 is not controlled, the orientation of the stage 110 at the time of film thickness measurement may differ for each wafer W. Specifically, the orientation of the stage 110 at each film thickness measurement point may differ for each wafer W. As described above, when the orientation of the stage 110 at each film thickness measurement point is different for each wafer W, the inclination of the stage 110 at each film thickness measurement point is also different for each wafer W. For example, as illustrated in FIG. 4, in a case where the stage 110 is inclined in the negative direction with respect to the horizontal plane in the front view at the film thickness measurement point A (i.e., the inclination angle $\alpha > 0$), when the orientation of the stage 110 differs by 180°, the stage 110 is inclined in the positive direction with respect to the horizontal plane in the front view at the same film thickness measurement point A (i.e., the inclination angle $\alpha < 0$) as illustrated in FIG. 5. The reference numeral "N" in FIGS. 4 and 5 refers to a notch. When the inclination of the stage 110 is different for each wafer W as described above at each film thickness measurement point, since the inclination of the wafer W on the stage 110 is also different, the light receiving result (specifically, the light intensity) of the reflected light by the light receiving/emitting unit 142 is also different.

In particular, an optical axis AX of the light receiving portion of the light receiving/emitting unit 142 (specifically, the optical axis of the condensing optical system for the light receiving sensor) is also installed at an angle from the vertical direction even when adjustments are made at the time of assembly. As described above, in a state where the optical axis of the light receiving portion of the light receiving/emitting unit 142 is inclined, the state in which the reflected light easily hits the light receiving portion of the light receiving/emitting unit 142 varies greatly depending on the orientation of the stage 110. For example, as illustrated in FIGS. 4 and 5, in a case where the optical axis AX of the light receiving portion of the light receiving/emitting unit 142 is inclined in the positive direction with respect to the vertical axis in front view, when the stage 110 is inclined in the positive direction with respect to the horizontal plane, the reflected light is likely to hit the light receiving portion of the light receiving/emitting unit 142. However, when the stage 110 is inclined in the negative direction with respect to the horizontal plane, it is difficult for the reflected light to hit the light receiving portion of the light receiving/emitting unit 142.

According to the results of repeated experiments conducted by the present inventors, it is found that the difference in the light receiving result of the reflected light by the light receiving/emitting unit 142 due to the inclination of the stage 110 affects the measurement accuracy in the film thickness measurement of an ultrathin film of 10 nm or less and further 1 nm or less. For example, even when the wafer W has a film formed by the same processing recipe, the measurement result of the film thickness at the center of the wafer differs greatly to about 0.1 nm by simply changing the orientation of the stage at the time of disposing by 120°, and the film thickness distribution shape differed greatly between the wafers W.

Therefore, in the present embodiment, the orientation controller 73 controls the rotation mechanism 112 based on the detection result of the orientation of the stage 110 by the absolute encoder 115 so that the orientation of the stage at the time of disposing is a desired orientation.

For example, when the orientation of the wafer W when disposed on the stage 110 (hereinafter, referred to as an "orientation of the stage at the time of disposing" in some cases) is constant, the orientation controller 73 controls the rotation mechanism 112 so that the orientation of the stage at the time of disposing is a predetermined reference orientation.

When the orientation of the wafer at the time of disposing is constant, by setting the orientation of the stage at the time of disposing to a predetermined reference orientation, the orientation of the stage 110 when the wafer W is disposed (hereinafter, referred to as a "relative orientation of the stage at the time of disposing" in some cases) is also constant with respect to the disposed wafer W. However, in the following cases, the orientation of the wafer at the time of disposing may not be constant. That is, in a case where the film forming system 1 continuously processes a plurality of wafers W by the processing device 40 as in the present embodiment, and the film thickness measuring device 60 measures each of the plurality of wafers W, the orientation of the wafer at the time of disposing may be different among the plurality of wafers W even when the process performed immediately before the measurement is common among the wafers W. Further, in a case where the film forming system 1 performs a plurality of processes by the processing device 40 to form a stacked film on the wafer W as in the present embodiment, and the film thickness measuring device 60 performs a measurement every time the plurality of processes are performed, the orientation of the wafer at the time of disposing may be different among the plurality of processes.

In order to keep the relative orientation of the stage at the time of disposing constant even when the orientation of the wafer at the time of disposing is not constant, the orientation controller 73 may control the rotation mechanism 112 so that the relative orientation of the stage at the time of disposing is a predetermined orientation.

For the information on the orientation of the wafer at the time of disposing, which is necessary in this case, a wafer orientation detector (not illustrated) may be provided in the processing station 11 and the detection result of the detector may be applied. When the orientation of the wafer at the time of disposing is known, the information on the orientation may be stored in advance in the storage unit of the controller 70.

According to the experiments conducted by the present inventors, by adjusting the orientation of the stage at the time of disposing as described above, for the wafer W on which the film is formed by the same processing recipe, the variation in the measurement result of the film thickness at the center of the wafer may be suppressed to 0.01 nm or less, and the film thickness distribution shape may be made the same among the wafers W.

The description of FIG. 3 is referred to again.

The distance estimator 74 estimates the relative working distance d based on the light receiving result of laser L2 emitted from the laser unit 143 at the laser light receiving portion of the reflected light by the wafer W on the stage 110.

The distance estimator 74 estimates the relative working distance d at each film thickness measurement point.

The distance estimator 74 may estimate a distance from the laser unit 143 to the stage 110 based on the light receiving result of laser L2 emitted from the laser unit 143 at the laser light receiving portion of the reflected light by the stage 110.

The height controller 75 controls the lifting mechanism 117 based on the estimation result of the relative working distance d by the distance estimator 74, and controls the height of the stage 110 to adjust the relative working distance d at the time of film thickness measurement.

When the relative working distance d is not adjusted and the stage 110 is inclined with respect to the horizontal plane, the relative working distance d is different for each film thickness measurement position.

As a result of repeated experiments by the present inventors, it is found that the difference in the relative working distance d affects the measurement accuracy in the film thickness measurement of an ultrathin film of 10 nm or less and further 1 nm or less. For example, when the relative working distance d changes by 1 mm, an error of 0.2 nm may occur in the measured film thickness.

Therefore, in the present embodiment, the height controller 75 controls the lifting mechanism 117 based on the estimation result of the relative working distance d of the distance estimator 74 so that the relative working distance d at the time of film thickness measurement becomes a desired distance.

For example, the height controller 75 controls the lifting mechanism 117 so that the relative working distance d at the time of film thickness measurement is corrected to a predetermined distance for each film thickness measurement point.

Further, the height controller 75 does not correct the relative working distance d for one film thickness measurement point, and may control the lifting mechanism 117 so that, for the other film thickness measurement points, the relative working distance d at the other film thickness measurement points is corrected to be the same as the relative working distance d at the film thickness measurement point.

When the stage 110 is inclined with respect to the horizontal plane, by correcting the relative working distance d in addition to adjusting the orientation of the stage at the time of disposing as described above, it is possible to measure the film thickness more accurately at each film thickness measurement point.

According to the experiments conducted by the present inventors, by performing both the adjustment of the orientation of the stage at the time of disposing and the relative working distance d, a film thickness distribution close to the in-plane distribution of the film thickness measured by a fluorescent X-ray analysis is obtained as compared with the case where only the adjustment for the orientation of the stage at the time of disposing is performed. The fluorescent X-ray analysis may accurately measure the film thickness. However, since X-rays are used, the analysis is not suitable for in situ film thickness measurement.

<Teaching at the Origin Position>

Figure 6:
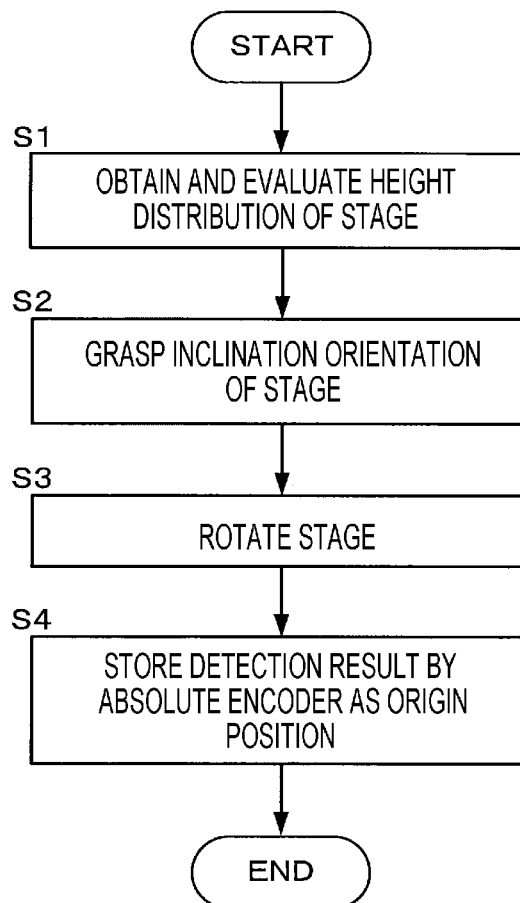
FIG. 6 is a flow chart illustrating an example of a teaching method for a reference orientation of the stage.

Subsequently, descriptions will be made on teaching of the reference direction (origin position) of the stage 110, which is performed prior to the film thickness measurement using the film thickness measuring device 60. FIG. 6 is a flow chart illustrating an example of a teaching method for a reference orientation of the stage 110. The teaching is performed when the film forming system 1 and the film thickness measuring device 60 are operated.

For example, after the stage 110 is first installed, the height distribution of the stage 110 is obtained under the control of the controller 70, and the obtained height distribution is evaluated by an operator (step S1).

Specifically, for example, after assembling the film thickness measuring device 60, the following processes are performed for each of the plurality of height measuring positions.

The movement controller 71 controls the horizontal movement mechanism 150 and the rotation mechanism 112 to move the laser unit 143 and rotate the stage 110 so that the irradiation point of the laser light emitted from the laser unit 143 with respect to the stage 110 coincides with the height measurement position.

After that, the controller 70 controls the laser light source unit 146 to irradiate the stage 110 with the laser light from the laser unit 143, and causes the laser light receiving portion to detect the reflected light at the irradiation point of the laser light with respect to the stage 110.

The distance estimator 74 estimates the distance from the laser unit 143 to the stage 110, which corresponds to the height of the stage 110, based on the detection result of the laser light receiving portion.

Subsequently, the controller 70 causes, for example, a display device (not illustrated) to display the estimated distance from the laser unit 143 to the stage 110 for each of the plurality of height measurement positions as the height distribution of the stage 110.

The operator evaluates the height distribution of the stage 110, for example, based on the display content of the display device.

When the operator grasps the inclination orientation of the stage 110 from the height distribution of the stage 110 (step S2), the operator rotates the stage 110 around the support shaft 111 according to the grasped inclination orientation of the stage 110 (step S3). Step S3 may be omitted.

Then, in response to the operator's operation of an operation input unit (not illustrated) of the controller 70, the controller 70 stores the detection result by the absolute encoder 115 in this state in the storage unit (not illustrated) as the origin position of the rotation angle of the stage 110, that is, the reference direction (of the stage 110) (step S4).

This completes the teaching of the reference orientation of the stage 110.

<Film Thickness Measuring Method>

Figure 7:
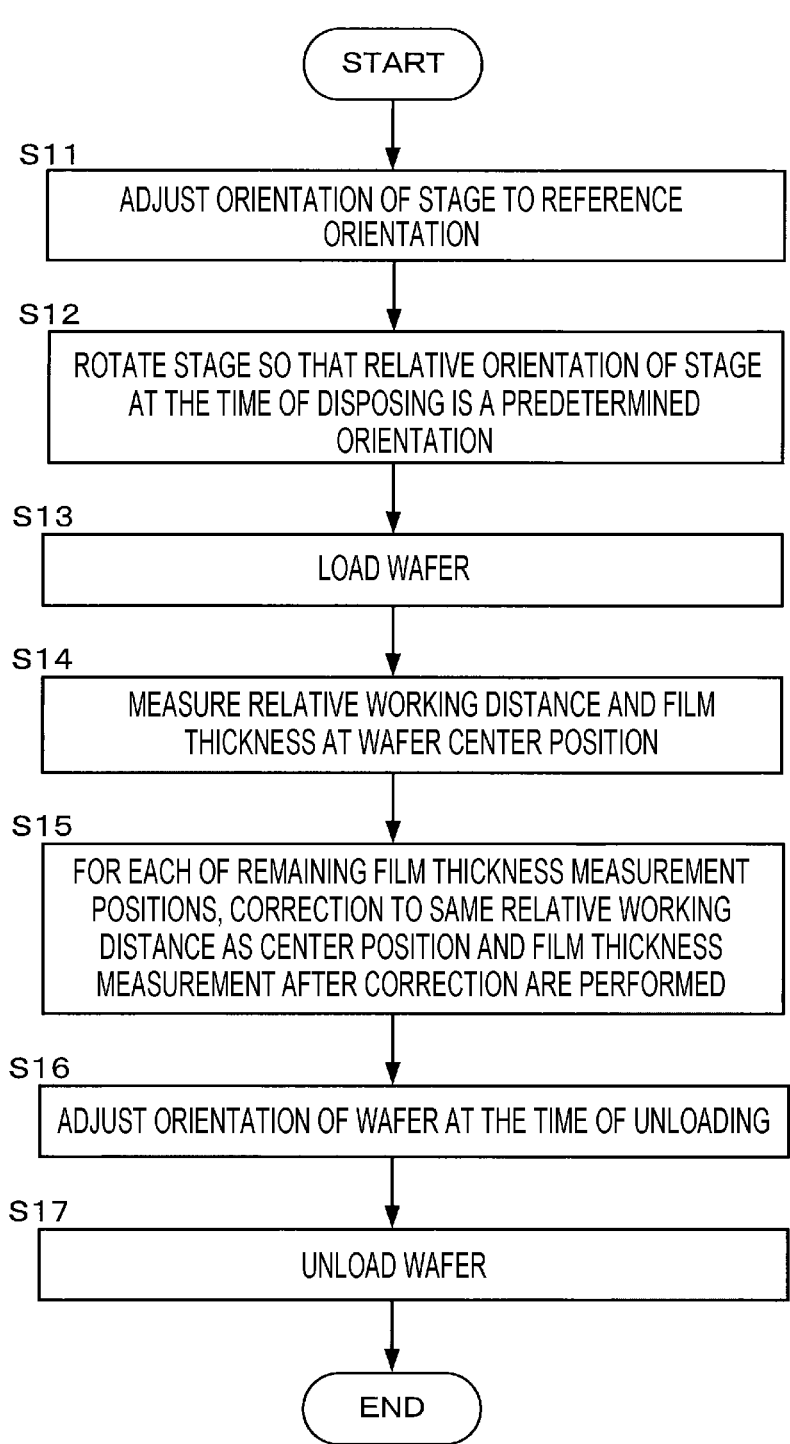
FIG. 7 is a flow chart illustrating an example of a film thickness measuring method using the film thickness measuring device.

Subsequently, descriptions will be made on a film thickness measuring method using the film thickness measuring device 60. FIG. 7 is a flow chart illustrating an example of a film thickness measuring method using the film thickness measuring device 60.

First, based on the detection result of the orientation of the stage 110 by the absolute encoder 115, the orientation controller 73 controls the rotation mechanism 112 to adjust the rotation angle of the stage 110 to the origin position stored in the storage unit, in other words, adjusts the orientation of the stage 110 to the reference orientation stored in the storage unit (step S11).

Subsequently, based on the detection result of the orientation of the stage 110 by the absolute encoder 115 and the information on the orientation of the wafer W when the wafer W is disposed on the stage 110, the orientation controller 73 controls the rotation mechanism 112 to rotate the stage 110 so that the relative orientation of the stage at the time of disposing is a predetermined orientation (step S12). It is not necessary to always make the relative orientation of the stage at the time of disposing a predetermined orientation, and this step S12 may be omitted.

Subsequently, under the control of the controller 70, the gate valve G21 is opened, the wafer W is loaded into the chamber 100 by the wafer transfer mechanism 503, and is disposed on the stage 110 (step S13). At this time, the orientation of the stage at the time of disposing is the reference orientation, or the relative orientation of the stage at the time of disposing is a predetermined orientation. After the wafer W is disposed, the gate valve G21 is closed.

Next, for example, the relative working distance d and the film thickness at the wafer center position are measured by adopting the center position of the wafer as the film thickness measurement position (step S14).

For example, the controller 70 first controls the rotation mechanism 112 to rotate the stage 110 so that the orientation of the wafer W on the stage 110 is a predetermined orientation. For this reason, the film thickness measuring device 60 may be provided with a detection mechanism for the orientation of the wafer W.

Further, the height controller 75 controls the lifting mechanism 117 to raise the stage 110 so that the height of the stage 110 becomes a predetermined measured height.

Subsequently, the movement controller 71 controls the horizontal movement mechanism 150 and the rotation mechanism 112 to move the laser unit 143 and rotate the stage 110 so that the irradiation point of the laser light emitted from the laser unit 143 with respect to the wafer W on the stage 110 coincides with the center position of the wafer.

Thereafter, the controller 70 controls the laser light source unit 146 to irradiate the wafer on the stage 110 with the laser light from the laser unit 143, and causes the laser light receiving portion to detect the reflected light from the irradiation point of the laser light with respect to the wafer W on the stage 110.

Then, the distance estimator 74 estimates the relative working distance d at the center position of the wafer based on the detection result of the laser light receiving portion.

Further, the controller 70 controls the horizontal movement mechanism 150 so that the irradiation point of the light emitted from the light receiving/emitting unit 142 with respect to the wafer W on the stage 110 coincides with the center position of the wafer, and moves the light receiving/emitting unit 142.

Thereafter, the controller 70 controls the light source unit 144 to irradiate the wafer W on the stage 110 with the light from the light receiving/emitting unit 142, and causes the light receiving portion of the light receiving/emitting unit 142 to detect the reflected light from the irradiation point of the light with respect to the wafer W on the stage 110.

Then, the film thickness estimator 72 estimates the film thickness at the center position of the wafer based on the detection result in the light receiving portion of the light receiving/emitting unit 142.

Subsequently, for each of the remaining film thickness measurement positions, a correction to the same relative working distance d as the center position of the wafer and a film thickness measurement after the correction are performed (step S15).

Specifically, for example, the following processes are performed for each of the remaining film thickness measurement positions.

The movement controller 71 controls at least one of the horizontal movement mechanism 150 and the rotation mechanism 112 so that the irradiation point of the laser light emitted from the laser unit 143 with respect to the wafer W on the stage 110 coincides with the film thickness measurement position, and causes either the movement of the laser unit 143 or the rotation of the stage 110 to be performed.

Thereafter, the controller 70 controls the laser light source unit 146 to irradiate the wafer W on the stage 110 with the laser light from the laser unit 143, and causes the laser light receiving portion to detect the reflected light from the irradiation point of the laser light with respect to the wafer Won the stage 110.

Then, the distance estimator 74 estimates the relative working distance d at the film thickness measurement position based on the detection result of the laser light receiving portion.

Subsequently, based on the estimation result of the distance estimator 74, the height controller 75 controls the lifting mechanism 117 to correct the height of the stage 110 so that the relative working distance d at the film thickness measuring position is the same as the relative working distance d at the center position of the wafer.

After the correction, the movement controller 71 controls the horizontal movement mechanism 150 so that the irradiation point of the light emitted from the light receiving/emitting unit 142 with respect to the wafer W on the stage 110 coincides with the film thickness measurement position, and moves the light receiving/emitting unit 142.

Thereafter, the controller 70 controls the light source unit 144 to irradiate the wafer W on the stage 110 with the light from the light receiving/emitting unit 142, and causes the light receiving portion of the light receiving/emitting unit 142 to detect the reflected light from the irradiation point of the light with respect to the wafer W on the stage 110.

Then, the film thickness estimator 72 estimates the film thickness at the film thickness measurement position based on the detection result in the light receiving portion of the light receiving/emitting unit 142.

When the film thickness measurement for all the film thickness measurement positions is completed, the orientation controller 73 controls the rotation mechanism 112 based on the detection result of the orientation of the stage 110 by the absolute encoder 115 so that the orientation of the wafer W at the time of unloading is a predetermined orientation (step S16). For this reason, the film thickness measuring device 60 may be provided with a detection mechanism for the orientation of the wafer W. Further, step S16 may be omitted. Even when the wafer W has the same orientation of the stage at the time of disposing, the orientation of the wafer W at the time of unloading may differ depending on the processing device of a transfer destination after measurement.

Thereafter, under the control of the controller 70, the gate valve G21 is opened, and the wafer W within the chamber 100 is unloaded by the wafer transfer mechanism 503 (step S17). After the wafer W is unloaded, the gate valve G21 is closed.

Then, steps S11 to S17 are performed on the next wafer W.

<Effect>

As described above, in the present embodiment, the orientation controller 73 controls the rotation mechanism 112 so that the orientation of the stage at the time of disposing is a desired orientation. Therefore, in the film thickness measurement of an ultrathin film of 10 nm or less, and further to 1 nm or less, it is possible to suppress the measurement result of the film thickness of the wafer W on the stage 110 from varying for each wafer W due to the inclination of the stage 110.

Further, in the present embodiment, the height controller 75 controls the lifting mechanism 117 so that the relative working distance d at the time of film thickness measurement becomes a desired distance. Therefore, in the film thickness measurement of an ultrathin film of 0 nm or less, and further 1 nm or less, even when the stage 110 is inclined, the film thickness may be measured with high accuracy at each film thickness measurement point.

The above-mentioned Japanese Patent Laid-Open Publication Nos. H05-149720 and H11-330185 disclose a technique for measuring a film thickness in situ by connecting modules for measuring a film thickness in a film forming system having a plurality of processing modules. However, this technique measures the film thickness using a laser, and does not assume the measurement of the film thickness of an ultrathin film, such as MRAM, having a thickness of 10 nm or less and further 1 nm or less. In the related art, the film thickness measurement of the film for MRAM needs to be performed after the wafer after the formation of the stacked film is unloaded from the film formation system.

According to the present embodiment, the film thickness of an ultrathin film having a thickness of 10 nm or less and further 1 nm or less may be measured in situ without being unloaded from the film forming system.

Further, in the present embodiment, the orientation controller 73 may control the rotation mechanism 112 so that the relative orientation of the stage at the time of disposing is a predetermined orientation. As a result, when the film forming system 1 continuously processes a plurality of wafers W by the processing device 40 and the film thickness measuring device 60 measures each of the plurality of wafers W, the relative orientation of the stage at the time of disposing may be set to be the same among the plurality of wafers W. Therefore, based on the measurement result by the film thickness measuring device 60, the processing result for the wafer W by the film forming system 1 may be appropriately evaluated for each wafer W.

The orientation controller 73 also has the following effects obtained by controlling the rotation mechanism 112 so that the relative orientation of the stage at the time of disposing is a predetermined orientation. That is, when the film forming system 1 performs a plurality of processes by the processing device 40 to form a stacked film on the wafer W, and the film thickness measuring device 60 performs a measurement every time the plurality of processes are performed, the relative orientation of the stage at the time of disposing may be set to be the same among the plurality of processes. Therefore, based on the measurement result by the film thickness measuring device 60, the processing result for the wafer W by the film forming system 1 may be appropriately evaluated for each processing related to the formation of the stacked film.

<Modification>

In the above-described example, the absolute encoder 115 is used to detect the orientation of the stage 110, but when the orientation of the stage 110, that is, the absolute rotation angle of the stage 110 may be detected, a device other than the absolute encoder 115 may be used.

Further, in the above-described example, the film thickness measuring device is provided as a module separate from the vacuum transfer chamber 31 and the processing device 40. However, for example, the film thickness measuring device may be a module integrated with the vacuum transfer chamber 31.

In the above-described example, the optical assembly 140 is configured to be movable in the depth direction of the device, but instead of or in addition to this, the stage 110 may be configured to be movable in the depth direction of the device.

Further, in the above-described example, the moving mechanism for moving each irradiation point includes the rotation mechanism 112, but the movement of each irradiation point may be performed by a moving mechanism, such as an XY stage, which does not include the rotation mechanism 112.

In the above-described example, the relative working distance d at the time of film thickness measurement is adjusted by using the lifting mechanism 117 that raises and lowers the stage 110. However, a lifting mechanism may be provided in the optical assembly 140, and the lifting mechanism may be used to adjust the relative working distance d at the time of film thickness measurement.

According to the present disclosure, it is possible to suppress the measurement result of the film thickness of the substrate on the stage from varying due to the inclination of the stage on which the substrate is disposed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film thickness measuring method comprising:

providing a film thickness measuring device including:

a stage configured to dispose a substrate thereon;

a light emitter/receiver configured to emit light for measuring a film thickness to the substrate disposed on the stage and receive a reflected light from the substrate disposed on the stage;

a distance meter configured to measure a distance between the light emitter/receiver and the substrate and an elevator configured to move the stage up and down;

a rotation driver configured to rotate the stage;

an orientation detector configured to detect an orientation of the stage; and a controller configured to control an overall operation of the film thickness measuring device;

forming, by the orientation detector, a light transmission and non-transmission pattern by a slit shape formed on a rotating plate connected to a rotation shaft of the rotation driver;

detecting a rotation angle, as the orientation of the stage, from an arbitrary reference point of the rotation shaft of the rotation driver based on the light transmission and non-transmission pattern, by the orientation detector;

detecting, by the orientation detector, an orientation of the stage when the substrate is disposed on the stage, based on the rotation angle of a support shaft connected to the stage;

rotating, by the rotation driver, the stage based on a detection result of the orientation of the stage such that the orientation of the stage becomes a desired orientation when the substrate is disposed thereon;

disposing the substrate on the stage having the desired orientation; and emitting the light from the light emitter/receiver and measuring a thickness of the film formed on the substrate based on a light receiving result of the reflected light of the light emitter/receiver, by the controller.

2. The film thickness measuring method according to claim 1, wherein the film thickness measuring method further includes:

measuring, by the distance meter, the distance from the light emitter/receiver to an irradiation point of light of the light emitter/receiver with respect to the substrate disposed on the stage; and adjusting, by the elevator, the distance from the light emitter/receiver to the irradiation point in the measuring of the thickness of the film based on a measurement result in the measuring of the distance.

3. The film thickness measuring method according to claim 2, wherein, in adjusting the distance, the controller controls the elevator to correct a height of the stage so that a distance at a film thickness measuring position is the same as a distance at a center position of the substrate.

4. The film thickness measuring method according to claim 3, wherein the film thickness measuring device further includes a horizontal mover configured to move the light emitter/receiver horizontally, and the film thickness measuring method further includes:

after adjusting the distance, moving, by the horizontal mover, the light emitter/receiver so that the irradiation point of the light emitted from the light emitter/receiver with respect to the substrate on the stage coincides with the film thickness measuring position.

\*    \*    \*    \*    \*